United States Patent
Komura et al.

(10) Patent No.: US 7,400,472 B2
(45) Date of Patent: Jul. 15, 2008

(54) HEAD SUSPENSION ASSEMBLY HAVING FLEXIBLE PRINTED WIRING BOARD WITH ALIGNMENT VOID ARRANGEMENT

(75) Inventors: Yukihiro Komura, Kawasaki (JP);
Mitsuhiro Izumi, Kawasaki (JP);
Hiroshi Ishiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/504,489

(22) Filed: Aug. 15, 2006

(65) Prior Publication Data
US 2007/0279805 A1    Dec. 6, 2007

(30) Foreign Application Priority Data
May 30, 2006    (JP) ............................. 2006-150426

(51) Int. Cl.
*G11B 5/48* (2006.01)
(52) U.S. Cl. ................. 360/245.9; 360/264.2
(58) Field of Classification Search ............. 360/245.8, 360/245.9, 246, 264.2, 266.3
See application file for complete search history.

(56) References Cited
U.S. PATENT DOCUMENTS

| | | | | |
|---|---|---|---|---|
| 4,891,723 A | * | 1/1990 | Zak .................... | 360/245.9 |
| 5,337,202 A | * | 8/1994 | Jabbarai et al. ........ | 360/264.2 |
| 5,655,285 A | * | 8/1997 | Bonn et al. ............ | 360/264.2 |
| 5,949,618 A | * | 9/1999 | Arya et al. ............ | 360/264.2 |
| 6,046,886 A | * | 4/2000 | Himes et al. .......... | 360/245.9 |
| 6,396,665 B1 | * | 5/2002 | Asano .................. | 360/264.2 |
| 6,765,763 B2 | * | 7/2004 | SeeToh et al. .......... | 360/264.2 |
| 2003/0086213 A1 | * | 5/2003 | Shin et al. ............ | 360/266.3 |
| 2003/0086214 A1 | * | 5/2003 | Shin ................... | 360/266.3 |

FOREIGN PATENT DOCUMENTS

| JP | 7-129944 | 5/1995 |
|---|---|---|
| JP | 2004-342270 | 12/2004 |

* cited by examiner

*Primary Examiner*—Craig A. Renner
(74) *Attorney, Agent, or Firm*—Greer, Burns & Crain, Ltd.

(57) ABSTRACT

A guide pin is set in common in first and second voids defined in the peripheries of first and second flexible printed wiring boards. The second void has the shape identical to the shape of the first void. When the guide pin rotates around a rotation axis so as to bring the guide pin in contact with the peripheries of the first and second flexible printed wiring boards inside the first and second voids, the first and second flexible printed wiring boards can be arranged. This leads to arrangement of the first and second flexible printed wiring boards at a time in a facilitated manner.

4 Claims, 6 Drawing Sheets

HEAD SUSPENSION ASSEMBLY HAVING FLEXIBLE PRINTED WIRING BOARD WITH ALIGNMENT VOID ARRANGEMENT

BACKGROUND OF THE INVENTION

1. Field of the Invention

The present invention relates to a method of arranging flexible printed wiring boards.

2. Description of the Prior Art

A head suspension assembly having the structure of a so-called long-tail is conventionally known, as disclosed in Japanese Patent Application Publication No. 2004-342270. The head suspension assembly includes intermediary flexible printed wiring boards extending backward from the head suspension. The intermediary flexible printed wiring boards are coupled to a main flexible printed wiring board attached to the supported end of a carriage. The head slider can thus be supplied with a writing current and a sensing current.

Image recognition is employed to position the intermediary flexible printed wiring boards on the main flexible printed wiring board when the intermediary flexible printed wiring boards are coupled to the main flexible printed wiring board. The terminals on the intermediary flexible printed wiring boards is aligned with the terminals on the main flexible printed wiring board through the image recognition. Even though the main flexible printed wiring board is designed to receive a plurality of the intermediary flexible printed wiring boards, the image recognition allows the positioning of only one of the intermediary flexible printed wiring boards at a time. There is no means for simultaneously positioning a plurality of the intermediary flexible printed wiring boards.

SUMMARY OF THE INVENTION

It is accordingly an object of the present invention to provide a method of arranging flexible printed wiring boards in a facilitated manner.

According to a first aspect of the present invention, there is provided a method of arranging flexible printed wiring boards, comprising: setting a guide pin in common in first and second voids defined in the peripheries of first and second flexible printed wiring boards, respectively, the second void having the shape identical to the shape of the first void; and rotating the guide pin around a rotation axis so as to bring the guide pin in contact with the peripheries of the first and second flexible printed wiring boards inside the first and second voids, thereby arranging the first and second flexible printed wiring boards.

The method allows establishment of the first void along the periphery of the first flexible printed wiring board. The second void is likewise defined along the periphery of the second flexible printed wiring board. The guide pin is set in the first and second voids in common for arrangement of the first and second flexible printed wiring boards. The rotation of the guide pin brings the guide pin in contact with the peripheries of the first and second flexible printed wiring boards in the first and second voids. This leads to arrangement of the first and second flexible printed wiring boards at a time in a facilitated manner.

Each of the first and second voids may comprise: an opening defined in the contour of the flexible printed wiring board; and an enlarged portion extending from the opening in the direction inward from the contour of the flexible printed wiring board, the enlarged portion getting enlarged from the opening.

The method allows the enlarged portion to extend from the opening in the direction inward from the contour of the flexible printed wiring board. The enlarged portion gets enlarged from the opening. The rotation of the guide pin brings the guide pin in contact with the peripheries of the first and second flexible printed wiring boards in the enlarged portions at positions remotest from the openings as well as at positions closest to the openings. The guide pin is allowed to reliably contact with the peripheries of the first and second flexible printed wiring boards in the enlarged portions. The peripheries of the first and second flexible printed wiring boards may extend along major arcs in the enlarged portions. The guide pin may have a contour circumscribed to the major arc within an imaginary plane perpendicular to the rotation axis.

A specific head suspension assembly is employed in the method, for example. The specific head suspension assembly may comprise: a head suspension; a flexible printed wiring board extending from one end located on the head suspension to the other end located in a space outside the head suspension; and a void formed in the periphery of the flexible printed wiring board at the other end of the flexible printed wiring board. The void may comprise: an opening defined in the contour of the flexible printed wiring board; and an enlarged portion extending from the opening in the direction inward from the contour of the flexible printed wiring board, the enlarged portion getting enlarged from the opening. The periphery of the flexible printed wiring board may extend along a major arc defined in the enlarged portion. The head suspension assembly may further comprise a terminal formed at the other end of the flexible printed wiring board, the terminal located at a position adjacent to the void.

According to a second aspect of the present invention, there is provided a method of making a carriage assembly, comprising: setting a guide pin in common in first and second voids defined in the peripheries of first and second flexible printed wiring boards attached to the tip end of a carriage, respectively, the first and second flexible printed wiring boards extending from the tip end of the carriage toward the supported end of the carriage, the second void having the shape identical to the shape of the first void; and rotating the guide pin around a rotation axis to bring the guide pin in contact with the peripheries of the first and second flexible printed wiring boards in the first and second voids, thereby arranging the first and second flexible printed wiring boards relative to a third flexible printed wiring board attached to the supported end of the carriage.

The method allows establishment of the first void along the periphery of the first flexible printed wiring board. The second void is likewise defined along the periphery of the second flexible printed wiring board. The guide pin is set in the first and second voids in common for arrangement of the first and second flexible printed wiring boards. The rotation of the guide pin brings the guide pin in contact with the peripheries of the first and second flexible printed wiring boards in the first and second voids. This leads to arrangement of the first and second flexible printed wiring boards relative to the third flexible printed wiring board in a facilitated manner.

Each of the first and second voids may comprise: an opening defined along the contour of the flexible printed wiring board; and an enlarged portion extending from the opening in the direction inward from the contour of the flexible printed wiring board, the enlarged portion getting enlarged from the opening. The peripheries of the first and second flexible printed wiring boards may extend along major arcs in the enlarged portions in the aforementioned manner. The guide pin may have the contour circumscribed to the major arcs within an imaginary plane perpendicular to the rotation axis of the guide pin in the aforementioned manner.

The method provides a specific carriage assembly, for example. The carriage assembly comprises: a carriage; a head slider attached to the tip end of the carriage; first and second flexible printed wiring boards each extending from one end attached to the head slider toward the supported end of the carriage, the first and second flexible printed wiring boards each having an exposed terminal at the other end; a third flexible printed wiring board attached to the supported end of the carriage, the third flexible printed wiring board having exposed terminals connected to the terminals of the first and second flexible printed wiring boards; a first void defined in the periphery of the first flexible printed wiring board at the other end of the first flexible printed wiring board; and a second void defined in the periphery of the second flexible printed wiring board at the other end of the second flexible printed wiring board, the second void having the shape identical to the shape of the first void. In this case, each of the first and second voids comprises: an opening defined in the contour of the flexible printed wiring board; and an enlarged portion extending from the opening in the direction inward from the contour of the flexible printed wiring board, the enlarged portion being enlarged from the opening. The peripheries of the flexible printed wiring boards may extend along major arcs in the enlarged portions. The terminals of the first and second flexible printed wiring boards may be located at positions adjacent to the voids, respectively.

According to a third aspect of the present invention, there is provided a method of making an electronic apparatus, comprising: setting a guide pin in common in first and second voids defined in the peripheries of first and second flexible printed wiring boards, respectively, the second void having the shape identical to the shape of the first void; and rotating the guide pin around a rotation axis to bring the guide pin in contact with the peripheries of the first and second flexible printed wiring boards in the first and second voids, thereby arranging the first and second flexible printed wiring boards. The method allows arrangement of the first and second flexible printed wiring boards in a relatively facilitated manner in the same manner as described above.

The method enables production of a specific electronic apparatus. The specific electronic apparatus comprises: first and second flexible printed wiring boards each having an exposed terminal; a third flexible printed wiring board having exposed terminals connected to the terminals of the first and second flexible printed wiring boards; a first void defined in the periphery of the first flexible printed wiring board at an end of the first flexible printed wiring board; and a second void defined in the periphery of the second flexible printed wiring board at an end of the second flexible printed wiring board, the second void having the shape identical to the shape of the first void. In this case, each of the first and second voids may comprise: an opening defined in the contour of the flexible printed wiring board; and an enlarged portion extending from the opening in the direction inward from the contour of the flexible printed wiring board, the enlarged portion being enlarged from the opening.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
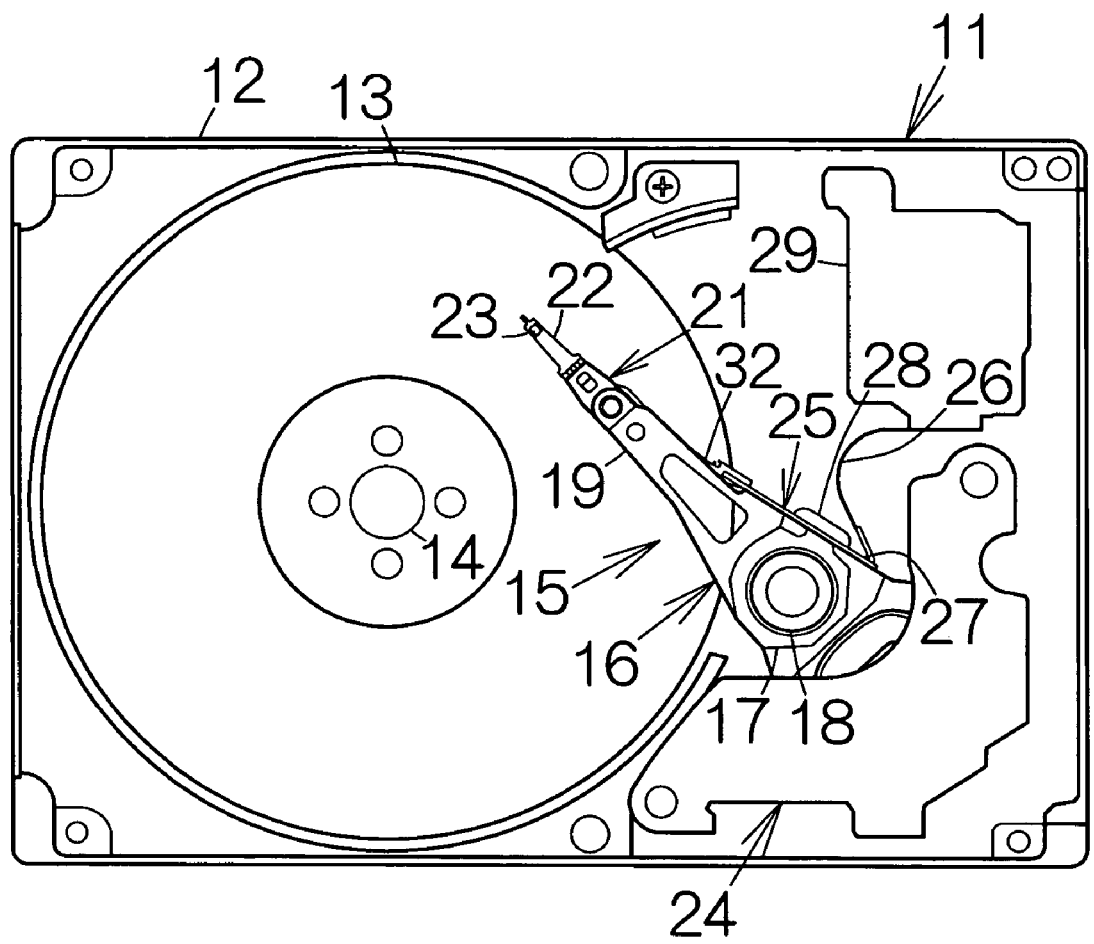
FIG. 1 is a plan view schematically illustrating the inner structure of a hard disk drive (HDD) as an example of an electronic apparatus according to an embodiment of the present invention.

FIG. 1 schematically illustrates the inner structure of a hard disk drive, HDD, 11 as an example of a storage medium drive or storage device according to the present invention. The hard disk drive 11 includes a box-shaped enclosure base 12 defining an inner space of a flat parallelepiped, for example. The enclosure base 12 may be made of a metallic material such as aluminum, for example. Molding process may be employed to form the enclosure base 12. An enclosure cover, not shown, is coupled to the enclosure base 12. The enclosure cover closes the opening of the enclosure base 12. Pressing process may be employed to form the enclosure cover out of a plate material, for example.

At least one magnetic recording disk 13 as a storage medium is enclosed in the inner space of the enclosure base 12. The magnetic recording disk or disks 13 are mounted on the driving shaft of a spindle motor 14. The spindle motor 14 drives the magnetic recording disk or disks 13 at a higher revolution speed such as 5,400 rpm, 7,200 rpm, 10,000 rpm, 15,000 rmp, or the like.

A carriage assembly 15 is also enclosed in the inner space of the enclosure base 12. The carriage assembly 15 includes a carriage 16. The carriage 16 includes a carriage block 17. The carriage block 17 is supported on a vertical support shaft 18 for relative rotation. Carriage arms 19 are defined in the carriage block 17. The carriage arms 19 are designed to extend in a horizontal direction from the vertical support shaft 18. The carriage block 17 may be made of aluminum, for example. Extrusion process may be employed to form the carriage block 17, for example.

A head suspension assembly 21 is attached to the front or tip end of the individual carriage arm 19. The head suspension assembly 21 is designed to extend forward from the carriage arm 19. The head suspension assembly 21 includes a head suspension 22. The head suspension 22 is designed to extend forward from the tip end of the carriage arm 19. A predetermined urging force is applied to the front or tip end of the head suspension 22 toward the surface of the corresponding magnetic recording disk 13. A flying head slider 23 is fixed to the tip end of the head suspension 22.

An electromagnetic transducer, not shown, is mounted on the flying head slider 23. The electromagnetic transducer includes a write element and a read element. The write element may include a thin film magnetic head designed to write magnetic bit data onto the magnetic recording disk 13 by utilizing a magnetic field induced at a thin film coil pattern. The read element may include a giant magnetoresistive (GMR) element or a tunnel-junction magnetoresistive (TMR) element designed to discriminate magnetic bit data on the magnetic recording disk 13 by utilizing variation in the electric resistance of a spin valve film or a tunnel-junction film, for example. Here, a heater, not shown, is incorporated in the flying head slider 23 at a position adjacent to the electromagnetic transducer. As conventionally known, the heater serves to generate heat so as to control the flying height of the flying head slider 23.

When the magnetic recording disk 13 rotates, the flying head slider 23 is allowed to receive an airflow generated along the rotating magnetic recording disk 13. The airflow serves to generate a positive pressure or a lift as well as a negative pressure on the flying head slider 23. The flying head slider 23 is thus allowed to keep flying above the surface of the magnetic recording disk 13 during the rotation of the magnetic recording disk 13 at a higher stability established by the balance between the urging force of the head suspension 22 and the combination of the lift and the negative pressure.

A power source or voice coil motor, VCM, 24 is coupled to the carriage block 17. The voice coil motor 24 serves to drive the carriage block 17 around the vertical support shaft 18. The rotation of the carriage block 17 allows the carriage arms 19 and the head suspension assemblies 21 to swing. When the carriage arm 19 swings around the vertical support shaft 18 during the flight of the flying head slider 23, the flying head slider 23 is allowed to move along the radial direction of the magnetic recording disk 13. The electromagnetic transducer on the flying head slider 23 can thus be positioned right above a target recording track on the magnetic recording disk 13.

The carriage assembly 15 includes a flexible printed circuit board unit 25. The flexible printed circuit board unit 25 is overlaid on the supported end of the carriage 16, that is, a carriage block 17. The flexible printed circuit board unit 25 includes a main flexible printed wiring board 26. An adhesive may be utilized to attach the main flexible printed wiring board 26 to the surface of a metal plate 27 such as a stainless steel plate, for example. A screw may be utilized to fix the metal plate 27 to the carriage block 17, for example. The main flexible printed wiring board 26 is designed to extend along an imaginary plane standing upright from the bottom plate of the enclosure base 12.

A head IC (integrated circuit) or preamplifier IC 28 is mounted on the surface of the main flexible printed wiring board 26. The preamplifier IC 28 is designed to supply the read element with a sensing current when the magnetic bit data is to be read. The preamplifier IC 28 is also designed to supply the write element with a writing current when the magnetic bit data is to be written. Likewise, the preamplifier IC 28 is designed to supply the heater with a controlling current for the heater. A small-sized circuit board 29 is located within the inner space of the enclosure base 12. The small-sized circuit board 29 is designed to supply the preamplifier IC 28 with the sensing current, the writing current and the controlling current. An intermediary flexible printed wiring board 32 is related to the individual head suspension 22. The intermediary flexible printed wiring boards 32 are utilized to supply the sensing current, the writing current and the controlling current from the main flexible printed wiring board 26 to the flying head slider 23.

Figure 2:
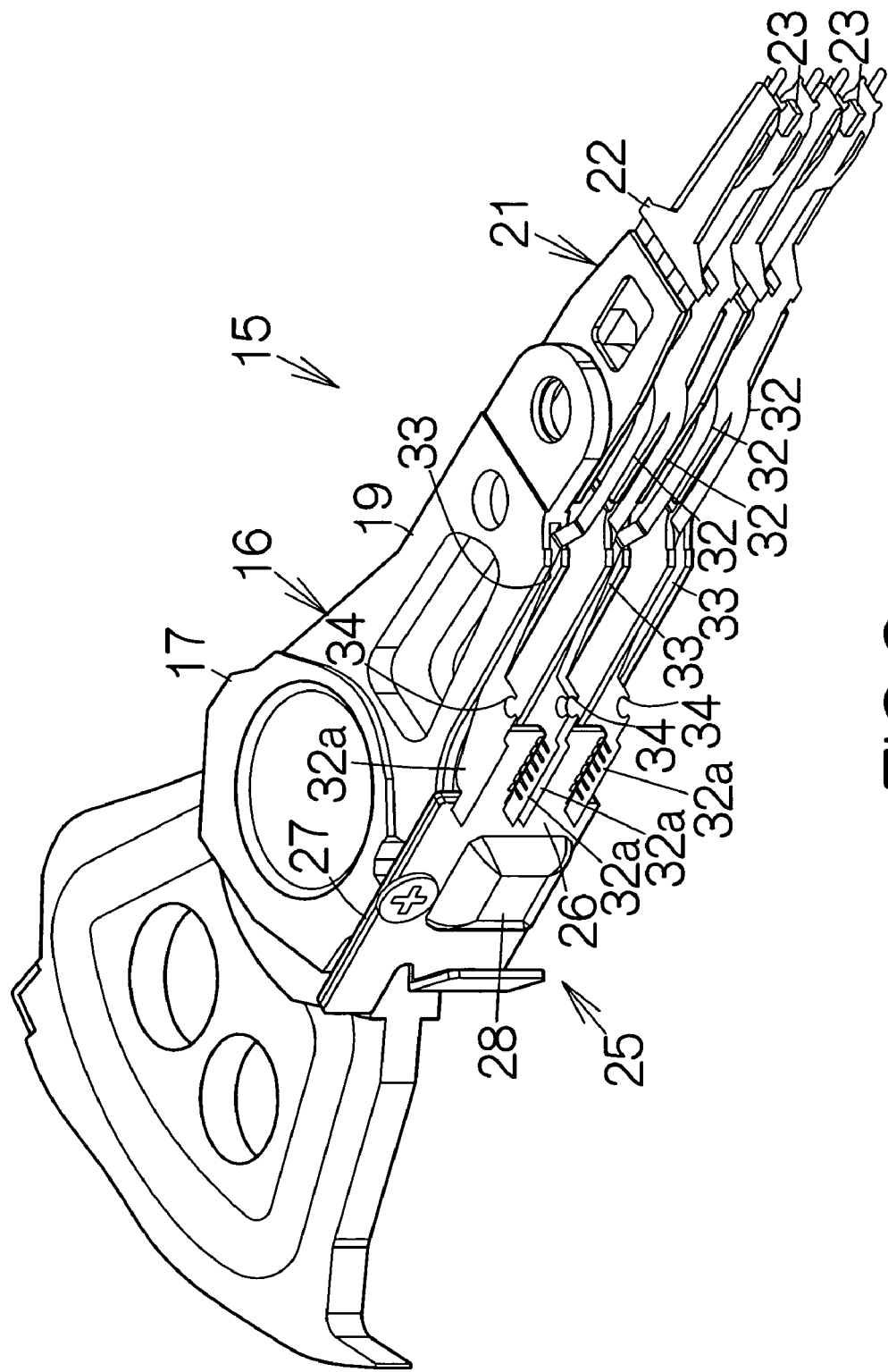
FIG. 2 is a perspective view schematically illustrating a carriage assembly.

As shown in FIG. 2, one end of the intermediary flexible printed wiring board 32 is fixed to the head suspension 22. A wiring pattern on the intermediary flexible printed wiring board 32 is connected to the flying head slider 23. An adhesive may be utilized to fix the intermediary flexible printed wiring board 32 on the head suspension 22, for example. The other end of the intermediary flexible printed wiring board 32 is located in a space outside the head suspension 22. The intermediary flexible printed wiring board 32 is designed to extend backward from the head suspension 22 along the side surface of the carriage arm 19. The head suspension assembly 21 has the structure of a so-called long-tail. The carriage arm 19 includes a groove 33. The intermediary flexible printed wiring board 32 is received in the groove 33. The groove 33 is defined in the side surface of the carriage arm 19.

The other end of the intermediary flexible printed wiring board 32 is coupled to the main flexible printed wiring board 26 on the carriage block 17. A tail end piece 32a is defined in the other end of the intermediary flexible printed wiring board 32. The tail end piece 32a is designed to extend along an imaginary plane parallel to the bottom surface of the enclosure base 12. The tail end piece 32a thus takes an attitude upright to the main flexible printed wiring board 26. Here, the intermediary flexible printed wiring boards 32 or tail end pieces 32a, four of those, for example, are coupled to the main flexible printed wiring board 26. The intermediary flexible printed wiring boards 32 are arranged in the vertical direction perpendicular to the bottom surface of the enclosure base 12. The individual tail end piece 32a defines avoid 34 in the periphery of the intermediary flexible printed wiring board 32. The voids 34 of all the tail end pieces 32a have an identical shape.

Figure 3:
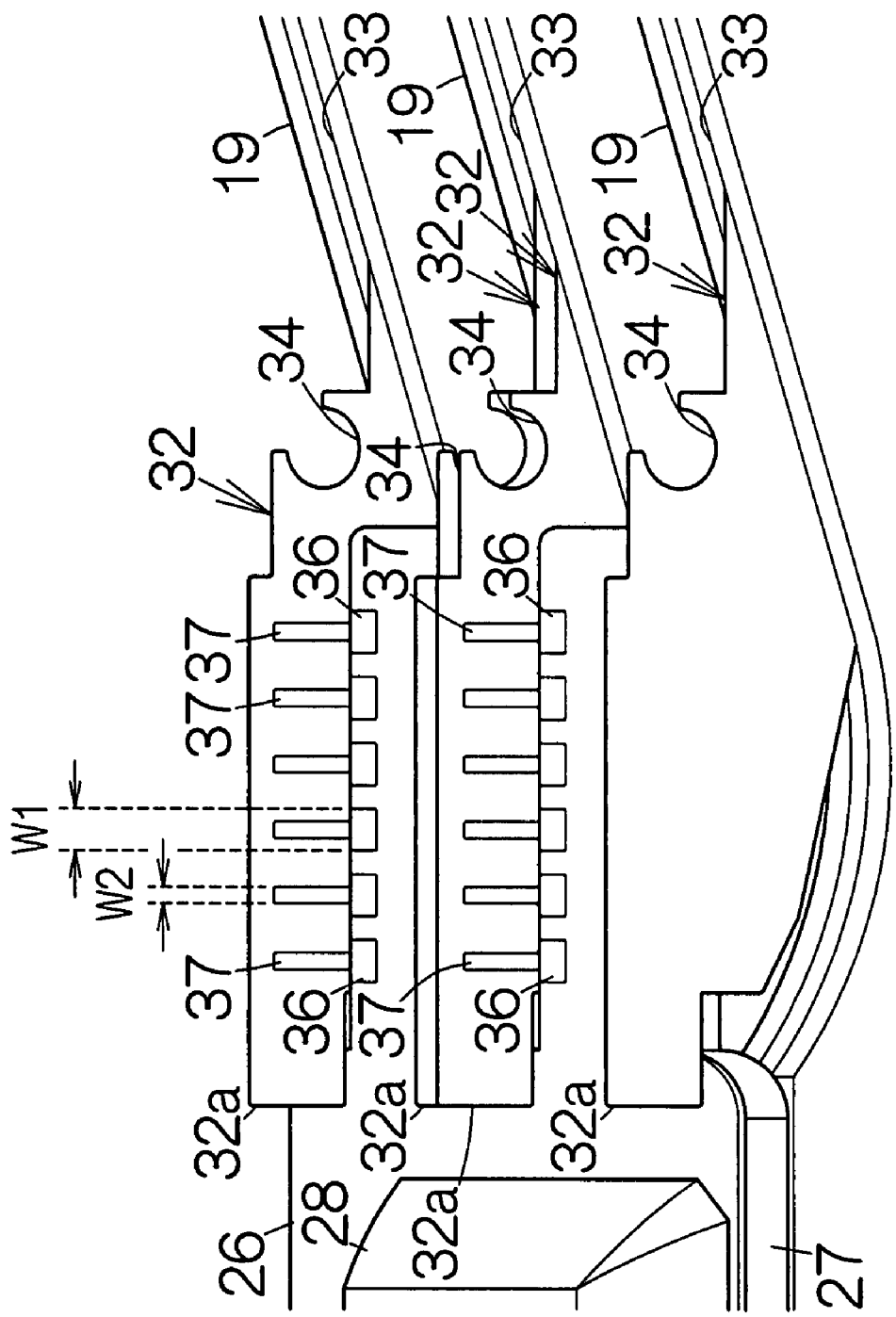
FIG. 3 is an enlarged partial perspective view schematically illustrating the carriage assembly.

As shown in FIG. 3, first terminals 36, six of those, for example, are exposed on the surface of the main flexible printed wiring board 26. The first terminals 36 are made of an electrically-conductive material such as copper. The first terminals 36 are connected to a wiring pattern, not shown, on the main flexible printed wiring board 26. The wiring pattern is connected to the preamplifier IC 28, for example. The aforementioned void 34 may be located at a position adjacent to the first terminals 36.

Second terminals 37, six of those for example, are exposed on the surface of the individual intermediary flexible printed wiring board 32. The second terminals 37 are made of an electrically-conductive material such as copper. The second terminals 37 are connected to a wiring pattern, not shown, on the intermediary flexible printed wiring board 32. The second terminals 37 are individually connected to the corresponding first terminals 36. Solder, not shown, is applied to bond the second terminals 37 to the corresponding first terminals 36, for example. An electrical connection is in this manner established between the first and second terminals 36, 37. This results in establishment of an electrical connection between the flying head slider 23 and the small-sized circuit board 29.

Figure 4:
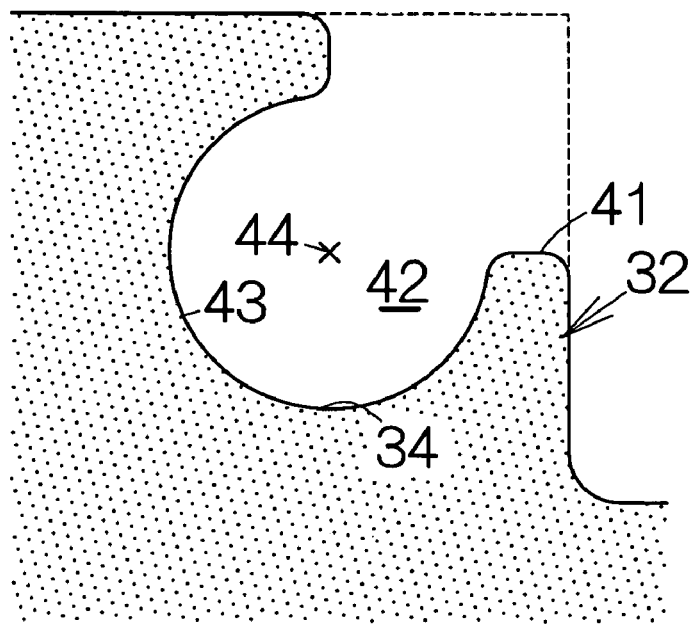
FIG. 4 is a plan view schematically illustrating the structure of a void.

As shown in FIG. 4, the void 34 includes an opening 41 defined along the contour of the intermediary flexible printed wiring board 32 or tail end piece 32a. An enlarged portion 42 is defined to extend from the opening 41 in the direction inward from the contour of the tail end piece 32a. The enlarged portion 42 gets enlarged from the opening 41. The periphery of the tail end piece 32a is designed to extend along a major arc 43 in the enlarged portion 42. The major arc 43 has the radius from a center 44. Here, the length of the major arc 43 may be set at approximately three quarters the perimeter of a circle having the aforementioned radius from the center 44, for example.

The main flexible printed wiring board 26 and the intermediary flexible printed wiring boards 32 individually include a metallic sheet such as a stainless steel thin plate. An insulating layer, an electrically-conductive layer and a protecting layer are overlaid on the metallic sheet in this sequence. The electrically-conductive layers form the aforementioned first and second terminals 36, 37, wiring patterns extending on the main and intermediary flexible printed wiring boards 26, 32, and the like. A resin material such as polyimide resin may be employed as the insulating layers and the protecting layers, for example. The insulating layers, the electrically-conductive layers and the protecting layers may be omitted at positions adjacent to the voids 34 in the intermediary flexible printed wiring boards 32.

Next, a detailed description will be made on a method of making the carriage assembly 15. The main flexible printed wiring board 26 is attached to the carriage block 17. The head suspension assemblies 21 are attached to tip ends of the carriage arms 19, respectively. The intermediary flexible printed wiring boards 32 are received in the grooves 33. The tail end pieces 32a are provisionally positioned relative to the main flexible printed wiring board 26 in this manner. The tail end pieces 32a are arranged side by side at predetermined intervals.

Figure 5:
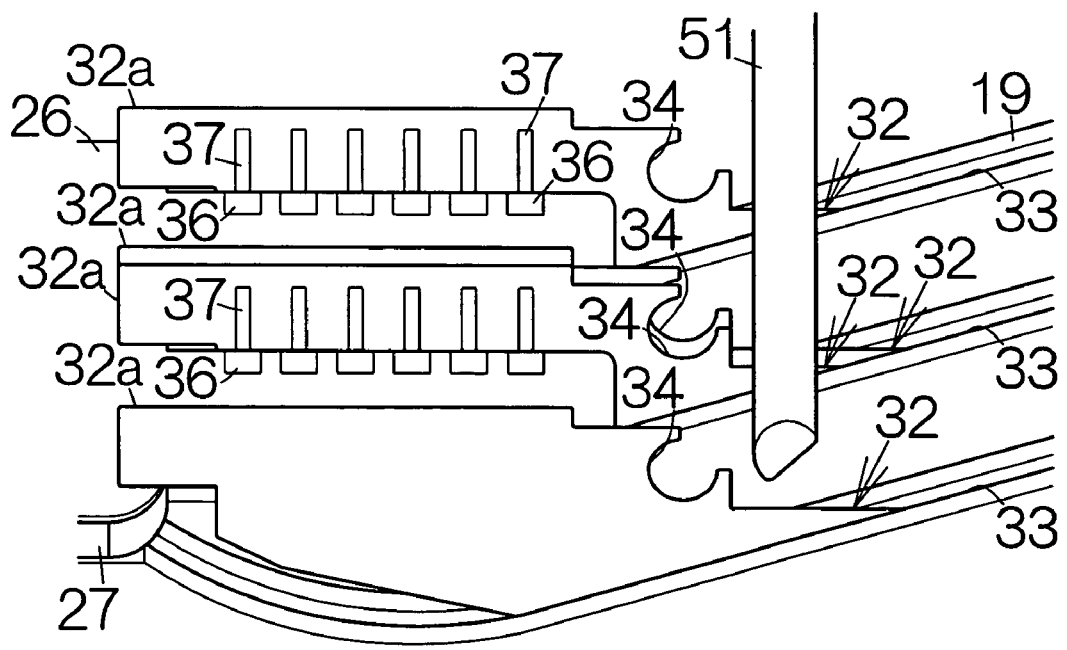
FIG. 5 is an enlarged partial perspective view schematically illustrating the relationship between a guide pin and first and second flexible printed wiring boards.
Figure 6:
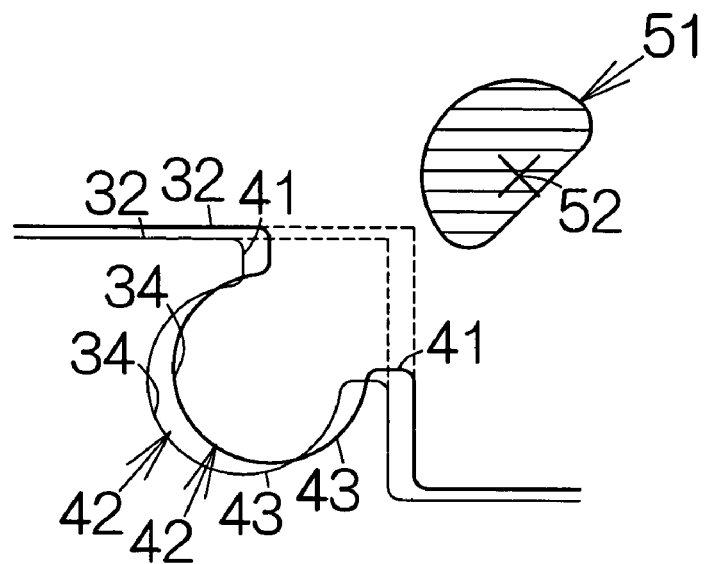
FIG. 6 is a plan view schematically illustrating the guide pin set in the voids.

The second terminals 37 of the individual tail end pieces 32a are aligned with the corresponding first terminals 36 of the main flexible printed wiring board 26. A guide pin 51 in the shape of a rod is utilized to position the second terminals 37, as shown in FIG. 5. The guide pin 51 is set to intersect all the tail end pieces 32a. As shown in FIG. 6, the guide pin 51 has a contour circumscribed to the aforementioned major arcs 43 within corresponding imaginary planes perpendicular to a rotation axis 52. The rotation axis 52 serves to define a center of an arc contouring the guiding pin 51 within the parallel planes. A cylindrical rod may partly be cut off to define a flat surface, extending in parallel with the rotation axis, to provide the guide pin 51.

Figure 7:
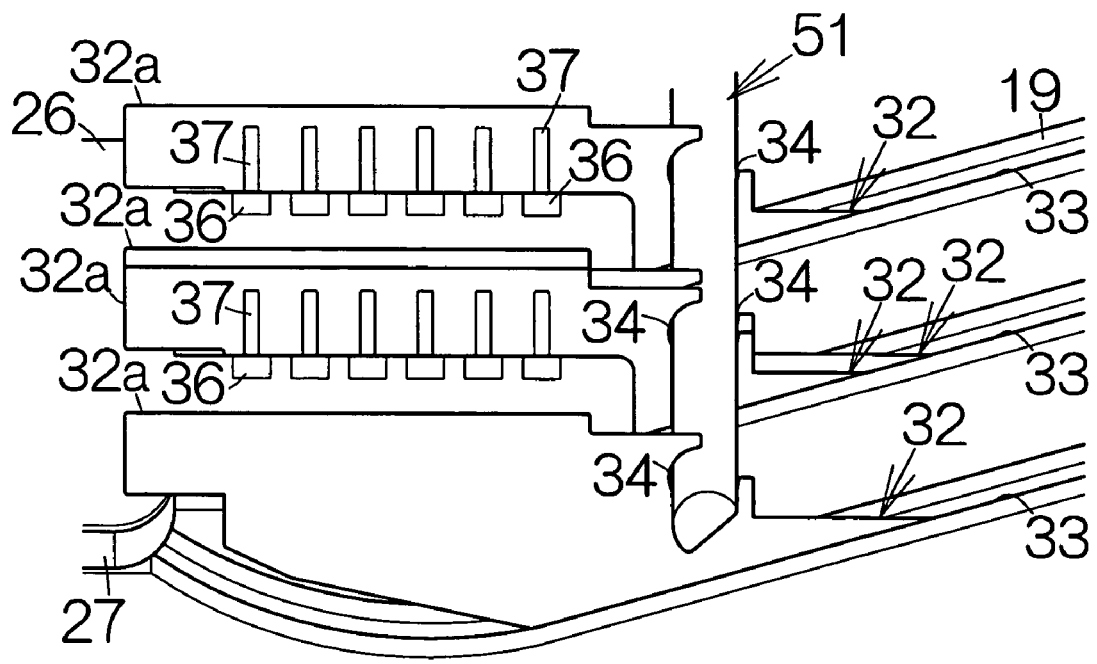
FIG. 7 is an enlarged partial perspective view schematically illustrating the guide pin set in the voids.

Since the individual tail end piece 32a is first roughly positioned relative to the main flexible printed wiring board 26, the tail end pieces 32a cannot accurately be aligned with each other. The guide pin 51 is then set in the voids 34. Since the guide pin 51 has the contour partly including a straight line within the parallel planes, the guide pin 51 can be inserted into the enlarged portions 42 of the voids 34 through the openings 41 in a facilitated manner. The guide pin 51 is set in the voids 34 of all the tail end pieces 32a in common, as shown in FIG. 7.

The guide pin 51 in the enlarged portions 42 is positioned at a predetermined reference position. The reference position is determined based on a relative position between the rotation axis 52 of the guide pin 51 and the main flexible printed wiring board 26. When the center 44 of the major arc 43 of the individual tail end piece 32a is aligned with the rotation axis 52 of the guide pin 51 at the reference position, the tail end piece 32a is set at a predetermined set position relative to the main flexible printed wiring board 26, as described later. The second terminals 37 are accurately aligned with the corresponding first terminals 36.

Figure 8:
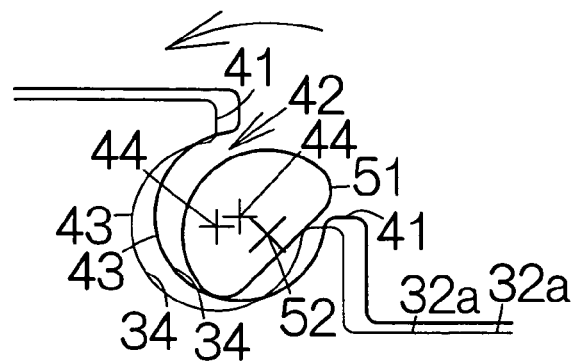
FIG. 8 is an enlarged partial plan view schematically illustrating the guide pin rotating in the void.
Figure 9:
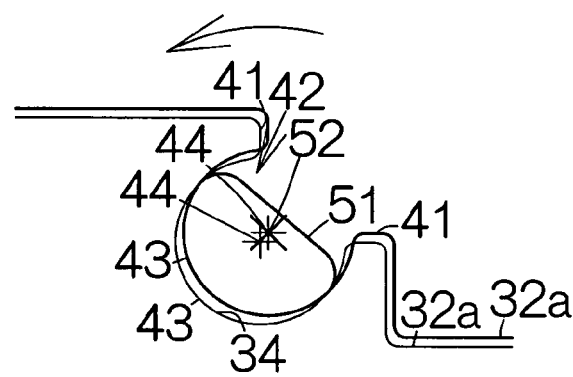
FIG. 9 is an enlarged partial plan view schematically illustrating the guide pin rotating in the void.

As shown in FIG. 8, the guide pin 51 is driven to rotate around the rotation axis 52 at the reference position. The rotation of the guide pin 51 allows the partial cylindrical surface of the guide pin 51 to come into contact with the peripheries of the tail end pieces 32a in the enlarged portions 42. Since the guide pin 51 has the contour circumscribed to the major arcs 43, the radius of the rotation of the guide pin 51 around the rotation axis 52 coincides with the radius of the major arcs 43. As shown in FIG. 9, the partial cylindrical surface of the guide pin 51 is thus aligned with the peripheries of some of the tail end pieces 32a in the enlarged portions 42 at positions remotest from the openings 41. These tail end pieces 32a allow the centers 44 of the major arcs 43 to align with the rotation axis 52 of the guide pin 51.

Figure 10:
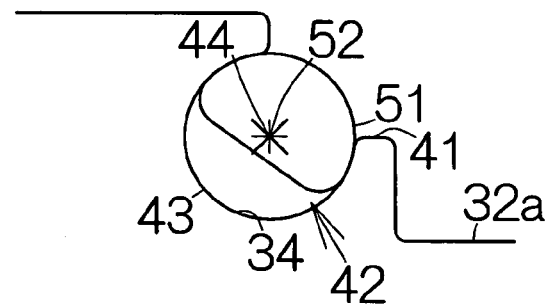
FIG. 10 is an enlarged partial plan view schematically illustrating the guide pin rotating in the void.

As is apparent from FIG. 9, the centers 44 of the major arcs 43 still deviate from the rotation axis 52 in the rest of the tail end pieces 32a. The further rotation of the guide pin 51 allows the partial cylindrical surface of the guide pin 51 to get aligned with the peripheries of all the tail end pieces 32a in the enlarged portions 42 at positions closest to the openings 41. The centers 44 of the major arcs 43 are thus aligned with the rotation axis 52 of the guide pin 51 in all the tail end pieces 32a, as shown in FIG. 10. All the tail end pieces 32a or intermediary flexible printed wiring boards 32 can in this manner completely be aligned.

Since the guide pin 51 is set at the reference position as described above, all the tail end pieces 32a, namely the intermediary flexible printed wiring boards 32, are arranged along the guide pin 51 while the second terminals 37 of the intermediary flexible printed wiring boards 32 are accurately aligned with the corresponding first terminals 36 of the main flexible printed wiring board 26. The second terminals 37 are soldered to the corresponding first terminals 36 after the second terminals 37 have been aligned with the first terminals 36. The guide pin 51 is pulled out of the voids 34 after completion of the soldering. The carriage assembly 15 is in this manner produced.

The hard disk drive 11 allows the arrangement of the main flexible printed wiring board 26 and the intermediary flexible printed wiring boards 32 with the assistance of the guide pin 51 set in the voids 34 of the intermediary flexible printed wiring boards 32 in common. The guide pin 51 is driven to rotate so that the partial cylindrical surface of the guide pin 51 is brought into contact with the peripheries of the intermediary flexible printed wiring boards 32 in the voids 34. The intermediary flexible printed wiring boards 32 can be arranged at the same time along the guide pin 51 in a facilitated manner. Furthermore, when the guide pin 51 is set at the reference position relative to the main flexible printed wiring board 26, the second terminals 37 of the intermediary flexible printed wiring boards 32 are accurately aligned with the corresponding first terminals 36 of the main flexible printed wiring board 26.

The individual void 34 includes the enlarged portion 42 extending from the opening 41 in the direction inward from the contour of the intermediary flexible printed wiring board 32. The enlarged portion 42 get wider or larger from the opening 41. The periphery of the intermediary flexible printed wiring board 32 extends along the major arc 43 in the enlarged portion 42. The rotating guide pin 51 is allowed to come into contact with the peripheries of the intermediary flexible printed wiring boards 32 in the enlarged portion 42 at positions remoter from the opening as well as at positions closer to the opening 41. The guide pin 51 can reliably contact with the peripheries of all the intermediary flexible printed wiring boards 32 in the enlarged portions 42. Even if the intermediary flexible printed wiring boards 32 shift in any direction within the imaginary planes perpendicular to the rotation axis 52 of the guide pin 51, the intermediary flexible printed wiring boards 32 can reliably be arranged.

A conventional main flexible printed wiring board includes four of the first terminals, while a conventional intermediary flexible printed wiring board includes four of the second terminals. The flying head slider 23 according to an embodiment of the present invention includes a heater for controlling the flying height of the flying head slider 23. Two of the first terminals 36 and two of the second terminals 37 are added to the main flexible printed wiring board 26 and intermediary flexible printed wiring boards 32, respectively. Since the size of the main flexible printed wiring board 26 and the intermediary flexible printed wiring boards 32 remain the same, the width W1 of the first terminal 36 and the width W2 of the second terminal 37 are individually reduced to two thirds the widths of conventional ones. Intervals are thus reduced between the adjacent first terminals 36, 36 as well as between the adjacent second terminals 37, 37. Accordingly, the intermediary flexible printed wiring boards 32 need be positioned relative to the main flexible printed wiring board 26 with a higher accuracy according to the embodiment of the present invention. The method of the present invention can considerably be effective to bond terminals on the aforementioned carriage 15.

The aforementioned method of arrangement may also be employed in other types of an electronic apparatus such as a notebook personal computer, a desktop personal computer, an optical disk drive, a magnetic tape drive, in addition to the aforementioned hard disk drive 11.

What is claimed is:

1. A head suspension assembly comprising:
   a head suspension;
   a flexible printed wiring board extending from one end located on the head suspension to an other end located in a space outside the head suspension; and
   a void formed in a periphery of the flexible printed wiring board at the other end of the flexible printed wiring board, wherein
   the void comprises:
   an opening defined in a contour of the flexible printed wiring board; and
   an enlarged portion extending inward from the contour of the flexible printed wiring board, said enlarged portion being enlarged from the opening, and
   the periphery of the flexible printed wiring board extends along a major arc in the enlarged portion.

2. A carriage assembly comprising:
   a carriage;
   a head slider attached to a tip end of the carriage;
   first and second flexible printed wiring boards each extending from one end attached to the head slider toward a supported end of the carriage, the first and second flexible printed wiring boards being attached to a carriage arm of the carriage, said first and second flexible printed wiring boards each having an exposed terminal at an other end;
   a third flexible printed wiring board attached to the supported end of the carriage, said third flexible printed wiring board having exposed terminals connected to the exposed terminals of the first and second flexible printed wiring boards;
   a first void defined in a periphery of the first flexible printed wiring board at the other end of the first flexible printed wiring board so that the first void is located outside of a peripheral edge of the carriage arm; and
   a second void defined in a periphery of the second flexible printed wiring board at the other end of the second flexible printed wiring board so that the second void is located outside of the peripheral edge of the carriage arm, the second void having a shape identical to a shape of the first void, wherein
   each of the first and second voids comprises:
   an opening defined in a contour of the flexible printed wiring board; and
   an enlarged portion extending inward from the contour of the flexible printed wiring board, said enlarged portion being enlarged from the opening.

3. The carriage assembly according to claim 2, wherein the terminals of the first and second flexible printed wiring boards are located at positions adjacent to the voids, respectively.

4. A carriage assembly comprising:
   a carriage;
   a head slider attached to a tip end of the carriage;
   first and second flexible printed wiring boards each extending from one end attached to the head slider toward a supported end of the carriage, said first and second flexible printed wiring boards each having an exposed terminal at an other end;
   a third flexible printed wiring board attached to the supported end of the carriage, said third flexible printed wiring board having exposed terminals connected to the exposed terminals of the first and second flexible printed wiring boards;
   a first void defined in a periphery of the first flexible printed wiring board at the other end of the first flexible printed wiring board; and
   a second void defined in a periphery of the second flexible printed wiring board at the other end of the second flexible printed wiring board, the second void having a shape identical to a shape of the first void, wherein
   each of the first and second voids comprises:
   an opening defined in a contour of the flexible printed wiring board; and
   an enlarged portion extending inward from the contour of the flexible printed wiring board, said enlarged portion being enlarged from the opening, and
   the peripheries of the first and second flexible printed wiring boards extend along major arcs in the enlarged portions.

* * * * *